United States Patent
Charalambides et al.

(10) Patent No.: US 11,184,975 B2
(45) Date of Patent: Nov. 23, 2021

(54) METHOD OF CREATING A FLEXIBLE CIRCUIT

(71) Applicant: CARNEGIE MELLON UNIVERSITY, Pittsburgh, PA (US)

(72) Inventors: Alexandros Charalambides, Pittsburgh, PA (US); Carmel Majidi, Pittsburgh, PA (US)

(73) Assignee: CARNEGIE MELLON UNIVERSITY, Pittsburgh, PA (US)

( * ) Notice: Subject to any disclaimer, the term of this patent is extended or adjusted under 35 U.S.C. 154(b) by 0 days.

(21) Appl. No.: 16/483,841

(22) PCT Filed: Feb. 6, 2018

(86) PCT No.: PCT/US2018/017095
§ 371 (c)(1),
(2) Date: Aug. 6, 2019

(87) PCT Pub. No.: WO2018/145106
PCT Pub. Date: Aug. 9, 2018

(65) Prior Publication Data
US 2020/0022255 A1    Jan. 16, 2020

Related U.S. Application Data

(60) Provisional application No. 62/499,868, filed on Feb. 6, 2017, provisional application No. 62/602,364, filed on Apr. 20, 2017.

(51) Int. Cl.
*H05K 1/02*    (2006.01)
*H05K 1/09*    (2006.01)
(Continued)

(52) U.S. Cl.
CPC ............ *H05K 1/0277* (2013.01); *H05K 1/09* (2013.01); *H05K 1/185* (2013.01); *H05K 3/0014* (2013.01);
(Continued)

(58) Field of Classification Search
USPC .................. 361/749, 760–764, 772–774; 174/254–260
See application file for complete search history.

(56) References Cited

U.S. PATENT DOCUMENTS 5,431,571 A    7/1995  Hanrahan et al.
5,531,020 A *  7/1996  Durand .................. C09J 163/00
                                             29/840
(Continued)

OTHER PUBLICATIONS

International Search Report and Written Opinion of the International Searching Authority for PCT Application PCT/US2018/017095 dated Apr. 26, 2018.

*Primary Examiner* — Tuan T Dinh
(74) *Attorney, Agent, or Firm* — Michael G. Monyok

(57) ABSTRACT

According to one embodiment is a flexible circuit comprising a flexible base, a conductive polymer supported by the base, and an integrated circuit component having an elongated electrical contact, wherein the elongated electrical contact penetrates into the conductive polymer, thereby providing a robust electrical connection. According to methods of certain embodiments, the flexible circuit is manufactured using a molding process, where a conductive polymer is deposited into recesses in a mold, integrated circuit components are placed in contact with the conductive polymer, and a flexible polymer base is poured over the mold
(Continued)

prior to curing. In an alternative embodiment, a multiple-layer flexible circuit is manufacturing using a plurality of molds.

10 Claims, 6 Drawing Sheets

(51) Int. Cl.
  *H05K 1/18* (2006.01)
  *H05K 3/00* (2006.01)
  *H05K 3/10* (2006.01)
  *H05K 3/34* (2006.01)
  *H05K 3/40* (2006.01)
  *H05K 3/46* (2006.01)

(52) U.S. Cl.
  CPC ............... *H05K 3/107* (2013.01); *H05K 3/34* (2013.01); *H05K 3/4038* (2013.01); *H05K 3/4644* (2013.01); *H05K 2201/0215* (2013.01); *H05K 2201/0329* (2013.01)

(56) References Cited

U.S. PATENT DOCUMENTS

| | | | |
|---|---|---|---|
| 7,129,584 B2* | 10/2006 | Lee | H01L 23/5387 257/778 |
| 7,935,892 B2* | 5/2011 | Nishikawa | H01L 24/29 174/260 |
| 2002/0105092 A1 | 8/2002 | Coyle | |
| 2004/0087033 A1* | 5/2004 | Schembri | B01L 3/505 506/39 |
| 2005/0156297 A1 | 7/2005 | Farnworth et al. | |
| 2008/0191174 A1* | 8/2008 | Ehrensvard | H05K 3/323 252/500 |
| 2010/0244235 A1 | 9/2010 | Kapusta et al. | |
| 2012/0051005 A1* | 3/2012 | Vanfleteren | H01L 23/3142 361/749 |
| 2013/0223034 A1* | 8/2013 | Rathburn | H05K 1/115 361/767 |
| 2013/0322032 A1* | 12/2013 | Shigetaka | G06F 3/044 361/749 |
| 2014/0178644 A1 | 6/2014 | Nystrom et al. | |
| 2015/0063977 A1 | 3/2015 | Barrette | |
| 2016/0249461 A1* | 8/2016 | Gilman | H05K 1/0296 |

\* cited by examiner

METHOD OF CREATING A FLEXIBLE CIRCUIT

CROSS-REFERENCE TO RELATED APPLICATIONS

This application claims the benefit under 35 U.S.C. § 119 of Provisional Application Ser. No. 62/499,868, filed Feb. 6, 2017, and Provisional Application Ser. No. 62/602,364, filed Apr. 20, 2017, each of which is incorporated herein by reference.

STATEMENT REGARDING FEDERALLY SPONSORED RESEARCH

This invention was made with government support under U.S. Army No. W81XWH-16-C-0186. The government has certain rights in this invention.

BACKGROUND OF THE INVENTION

The invention relates to a flexible circuit. More specifically, the invention relates to a flexible circuit that incorporates rigid components such as resistors, capacitors, wireless-enabled microprocessors, or other integrated circuit components. The invention further relates to a method of making the flexible circuit.

Flexible circuits have many uses, including as sensors adapted to be worn in contact with the skin of a user. For example, a wearable, flexible circuit can be used as a sensor in medical applications, providing physiological metrics in real time, such as heartrate, temperature, blood pressure, and blood oxygenation. In addition, being able to collect physiological data noninvasively and transmit that data wirelessly would enable big-data machine learning algorithms to autonomously identify sick and healthy patients. With rigid devices, the lack of flexibility can cause issues with data acquisition, since the interface between the non-flexible device and flexible skin is not ideal. For example, wrist-worn general wellness devices, such as fitness watches, can suffer from inaccurate heart rate measurements due to movement of the device relative to the skin.

Attempts have been made to manufacture flexible sensors and circuits to address the problems associated with non-flexible devices. In one example, a flexible circuit was created using a mold having recesses defining a conductive path, where the recesses are filled with a conductive elastomer then coated with a plain elastomer to support the conductive layer. In this example, rigid circuit components, if present, are placed directly onto the conductive elastomer material before the plain elastomer is added and the elastomers cured. However, the contact resistance between the integrated circuit components and conductive elastomer can be prohibitively high, particularly after stretching the device. Other attempts have used liquid conductors or meandering wires rather than a conductive elastomer, but these techniques can require expensive manufacturing processes, such as the sputter deposition of copper. While these examples demonstrate flexible circuits, the ability to incorporate non-flexible circuit components is marginal and the costs of these techniques can be prohibitive to commercial-scale manufacturing. Therefore, it would be advantageous to develop a flexible circuit that incorporates non-flexible integrated circuit components and a low-cost method of manufacturing the circuits.

BRIEF SUMMARY

According to embodiments of the present invention is a flexible circuit comprising a conductive polymer layered with a polymer base. In one embodiment, rigid circuit components are connected directly to the conductive polymer through elongated electrical contacts, which allow an electrical connection between the conductive polymer and the rigid component with negligible contact resistance. To manufacture the flexible circuit, the conductive polymer is placed in the recesses of a mold, which define the electrical pathway of the circuit. The rigid integrated circuit components, with the elongated electrical contacts, are then placed into contact with the conductive polymer. In some embodiments, a conductive epoxy is used in the junction between the electrical contact of the component and the conductive polymer. A flexible polymer base is then poured over the mold and cured. Once cured, the flexible circuit comprising the conductive polymer, integrated circuit components, and flexible base is removed from the mold. In alternative embodiments, the method of manufacture allows multiple layers to be combined in a single circuit, with the conductive elements of each layer electrically connected, such as through the use of a via, enabling the manufacture of complex circuits. The main advantage of this approach over other methods is that it's low-cost and produces a highly flexible and stretchable device which is ideal for comfort and usability when worn next to the skin.

DETAILED DESCRIPTION

Figure 1A:
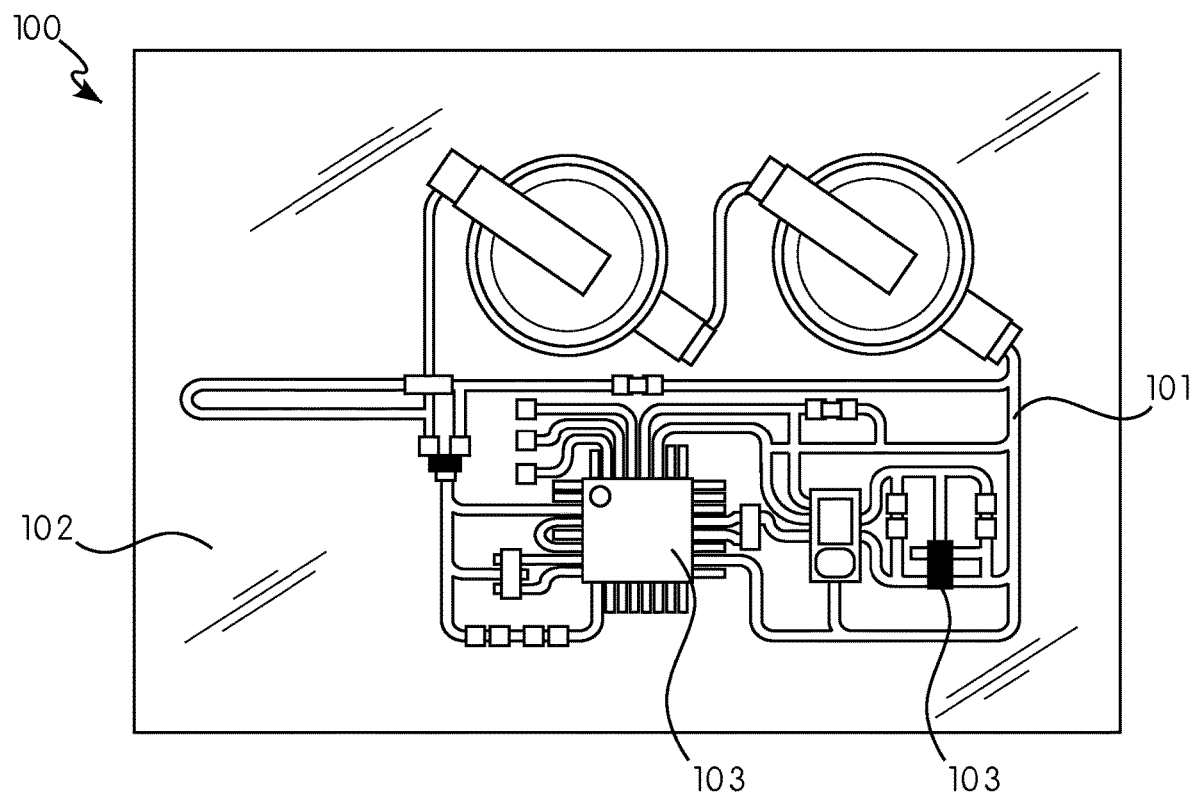
FIGS. 1A-1B show examples of the flexible circuit according to certain embodiments.
Figure 1B:
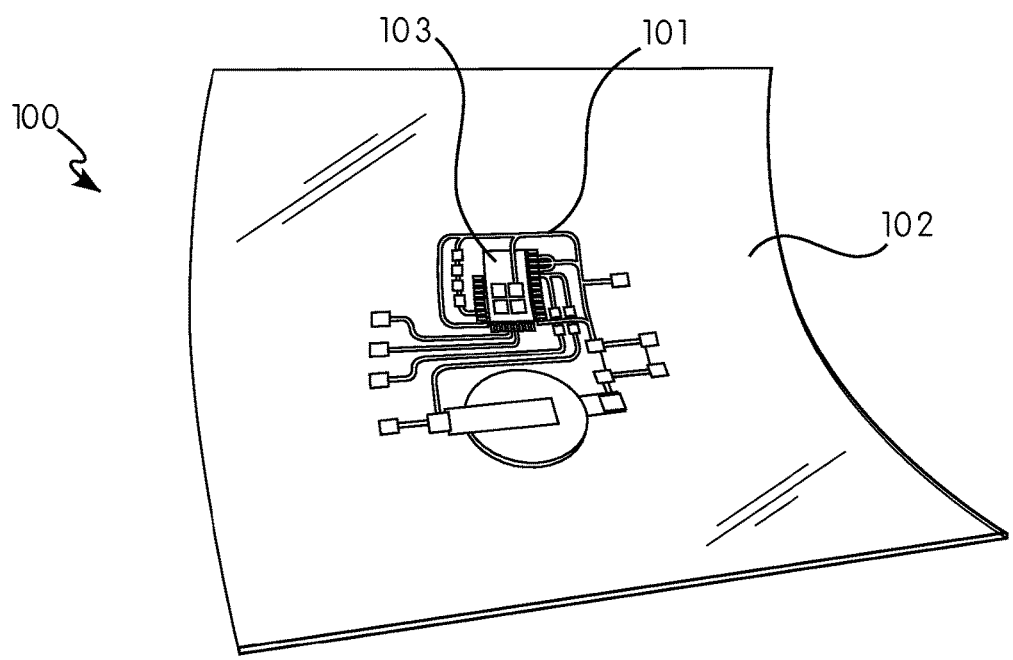

According to certain embodiments, the flexible circuit 100 comprises a conductive polymer 101, a flexible base 102, and at least one integrated circuit component 103. FIG. 1A shows an example of a flexible circuit 100 used as a heart monitor, where the conductive polymer 101 is visible on a surface of the flexible base 102. FIG. 1B demonstrates the flexibility of another example circuit 100, with the flexible base 102 and conductive polymer 101 bending in a curve. During the manufacturing process, the conductive polymer 101 and flexible base 102 are bonded together, providing support for the relatively thin lines of conductive polymer 101. Further shown in FIGS. 1A-1B are several integrated circuit components 103, in electrical contact with the conductive polymer 101.

In the example embodiments shown in FIGS. 1A-1B, an electrically conductive silver/polydimethylsiloxane material is used as the conductive polymer 101, where silver filler-particles are dispersed within the polydimethylsiloxane polymer. The filler-particles provide conductivity and the polymer (or elastomer) provides flexibility and the ability to stretch. Alternative filler-particles such as carbon black, carbon nanotubes, silver flakes, silver nanotubes, and eutectic gallium indium (eGaIn) may be used, for example.

Similarly, the filler-particles may be combined with alternative polymers such as polymethylmethacrylate or polytetrafluoroethylene, for example.

The flexible base 102 in the example embodiments is polydimethylsiloxane. As will be described in further detail, the flexible base 102 is comprised of a curable polymer which is initially applied in the manufacturing process as a liquid. As such, while polydimethylsiloxane is used as the flexible base 102 in the examples depicted in FIGS. 1A-1B, any of several flexible polymers that can be cured or thermoset may be used. In addition, while polydimethylsiloxane is used for the flexible base 102 and in the conductive polymer 101 in the example embodiments, the flexible base 102 may or may not be the same material as the polymer used in the conductive polymer 101.

Figure 2A:
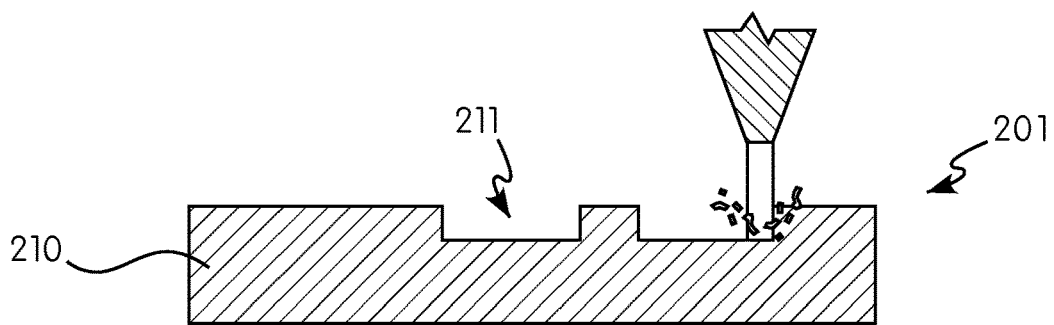
FIGS. 2A-2D depicts a method of manufacturing the flexible circuit, according to one embodiment.

To create the flexible circuit 100, a molding process is used. FIGS. 2A-2D show the various steps in this process. At step 201, as shown in FIG. 2A, the mold 210 is etched, cut, or engraved with recesses 211 forming a pattern that replicates the desired conductive pathway in the flexible circuit 100. The conductive pathway is similar to the conductive traces and pads in a printed circuit board. The recesses 211 can vary in depth, width, and shape depending on the intended application of the flexible circuit 100 or patterning process used to create the mold 210. For example, in one embodiment, a laser is used to cut the pattern in an acrylic mold material. The laser provides a fast cutting process, but produces a lower quality mold 210. In an alternative embodiment, a CNC milling machine cuts the recesses 211 in a block of acrylic, metal, wax, or other similar material. A CNC mill can produce a higher quality mold 210, but requires more cutting time than a laser cutter. In addition, a CNC mill may require additional programming to convert the circuit design into data readable by the mill. FIG. 3 depicts a finished mold 210 with recesses 211 etched onto the surface of the mold 210.

Figure 2B:
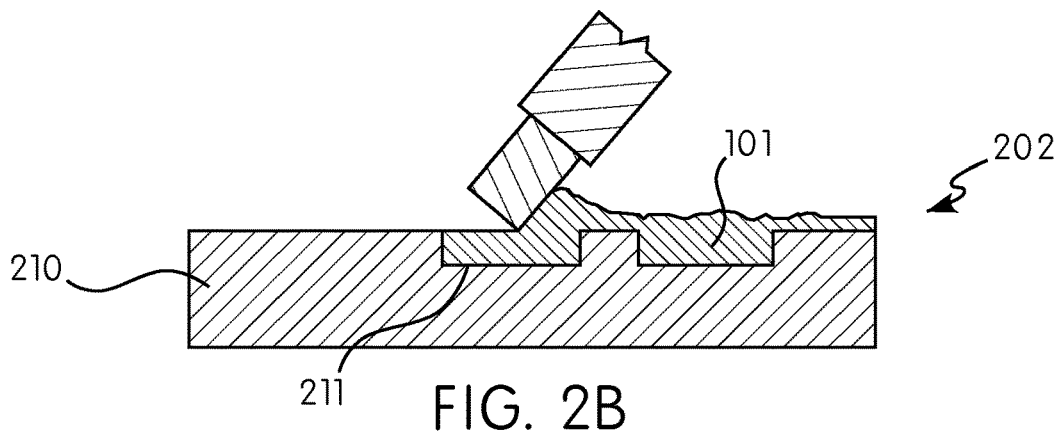
Figure 3:
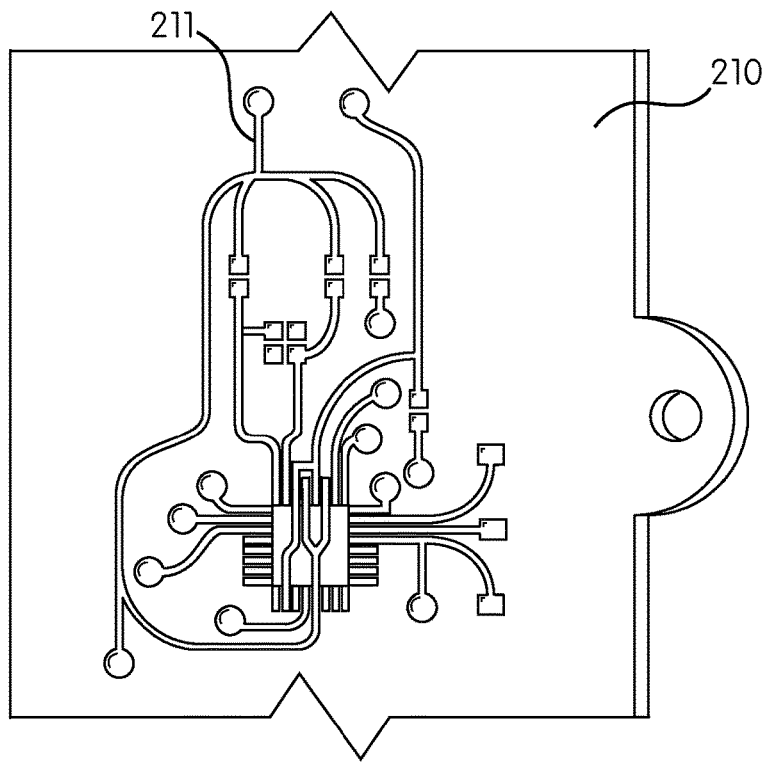
FIG. 3 shows a mold used to manufacture the flexible circuit, with recesses etched into the surface of the mold.

At step 202, as shown in FIG. 2B, the conductive polymer 101 is deposited into the recesses 211. In one embodiment, the conductive polymer 101 is spread across the surface of the mold 210, forcing the conductive polymer 101 into the recesses 211 and on the surface of the mold 210. Excess conductive polymer 101 is then removed from the surface, resulting in the conductive polymer 101 remaining only in the recesses 211.

Figure 2C:
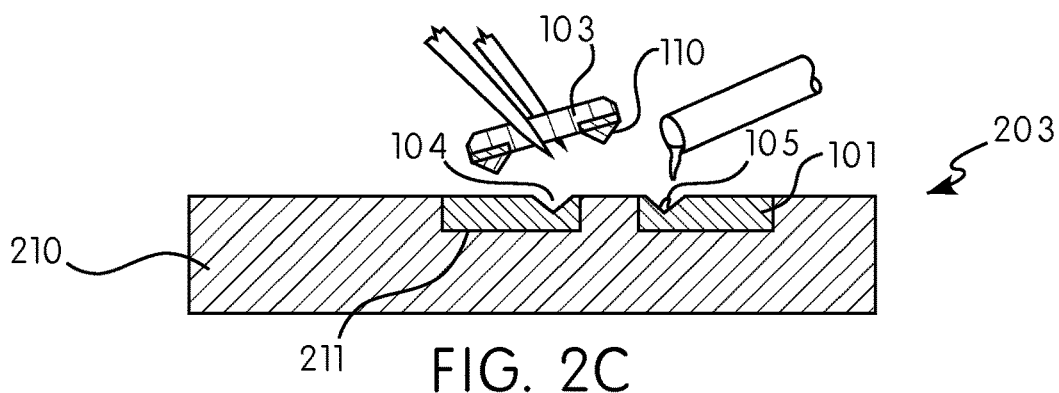
Figure 2D:
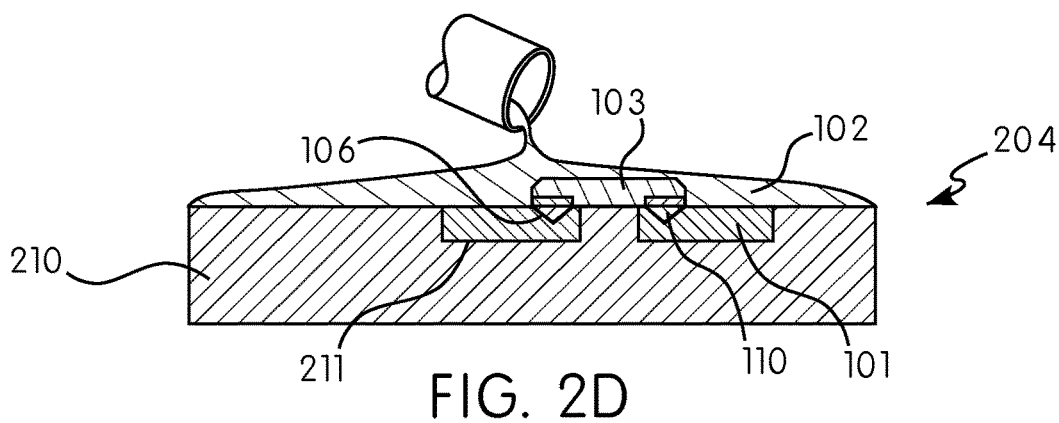

In step 203, as shown in FIG. 2C, integrated circuit components 103 are placed in contact with the conductive polymer 101. In one embodiment, the components 103 with elongated electrical contacts 110 are simply placed on the surface of the mold 210 so that the contacts 110 of the component 103 are engaged with the conductive polymer 101. In an alternative embodiment, the integrated circuit component 103 is placed in contact with the conductive polymer 101, the conductive polymer 101 is cured, and then the integrated circuit component 103 is removed, leaving an indentation 104 formed by the elongated contacts 110 extending from the component 103. The indentation 104 is then filled with a conductive epoxy 105, such as a silver epoxy, and the component 103 re-positioned on the conductive polymer 101 and cured. In this embodiment, the epoxy 105 provides a more robust connection between the integrated circuit component 103 and the conductive polymer 101.

In step 204, the polymer base 102 is poured over the mold, at least partially encapsulating the integrated circuit components 103. When cured, the polymer base 102 bonds to the conductive polymer 101, allowing the circuit 100 to be removed from the mold 210 as a unitary circuit.

Figure 4:
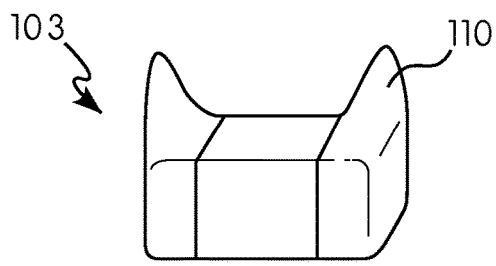
FIGS. 4-6 show integrated circuit components fitted with elongated electrical contacts, or solder cones, according to some embodiments.
Figure 5:
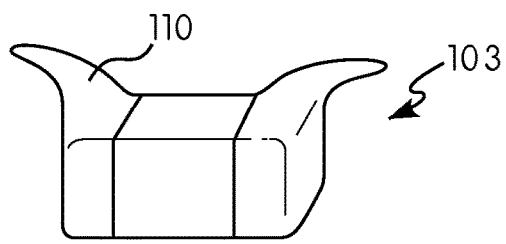
Figure 6:
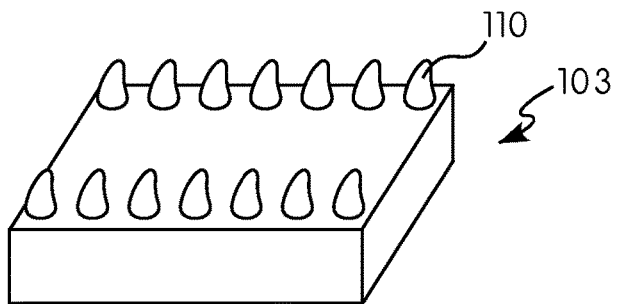

As discussed in step 203, in certain embodiments the integrated circuit component 103 is pressed into the conductive polymer 101 to create an indentation in the conductive polymer 101. FIGS. 4-6 depict various integrated circuit components 103 that have been fitted with elongated contacts 110. Often, integrated circuit components 103 have a flat profile and would therefore sit on the surface of the layer of conductive polymer 101, preventing a robust mechanical or electrical connection. The elongated contacts 110 extend from a surface of the component 103, allowing the contact 110 to penetrate into the conductive polymer 101 during the manufacturing process. The elongated contacts 110 can be added to standard integrated circuit components 103, such as by adding a cone-shaped bead of solder to the component 103. Alternatively, the elongated contact 110 can be integrated into the component 103 when it is manufactured. The elongated contacts 110 enable high quality electrical and mechanical interfacing between the component 103 and the conductive polymer 101, particularly when an epoxy 105 is used at the interface 106 between the two.

In an alternative manufacturing method, a multilayer approach is used. As shown in FIGS. 7A-7D, rather than using a single mold 210, two molds 210 are patterned with recesses 211, filled with conductive polymer 101, fitted with integrated circuit components 103, and positioned opposite each other with a polymer base 102 disposed between the two molds 210. By using two molds 210, each side of the base 102 in the completed flexible circuit 100 has electrical pathways.

Figure 7A:
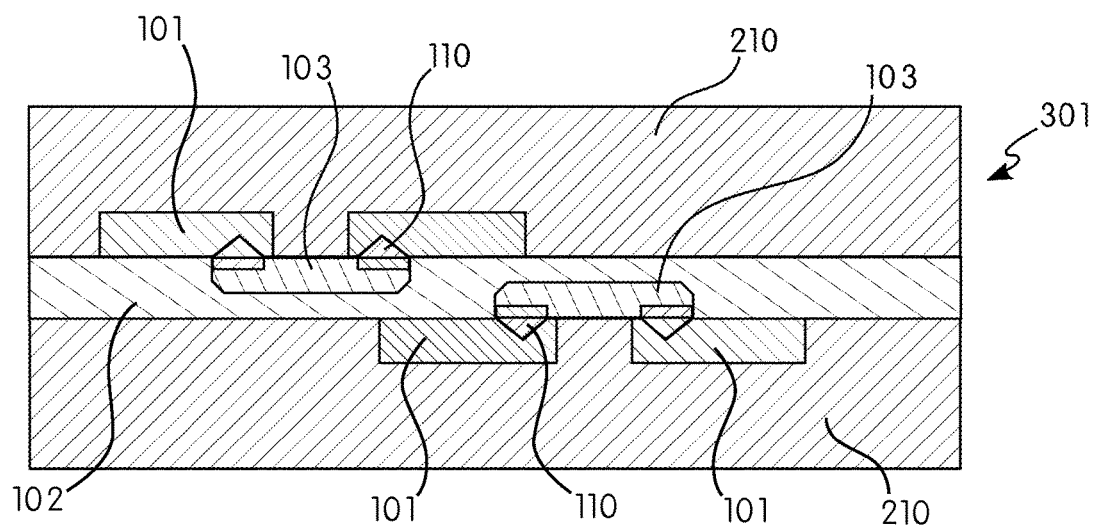
FIGS. 7A-7D depicts a method of manufacturing a multi-layer circuit.
Figure 7B:
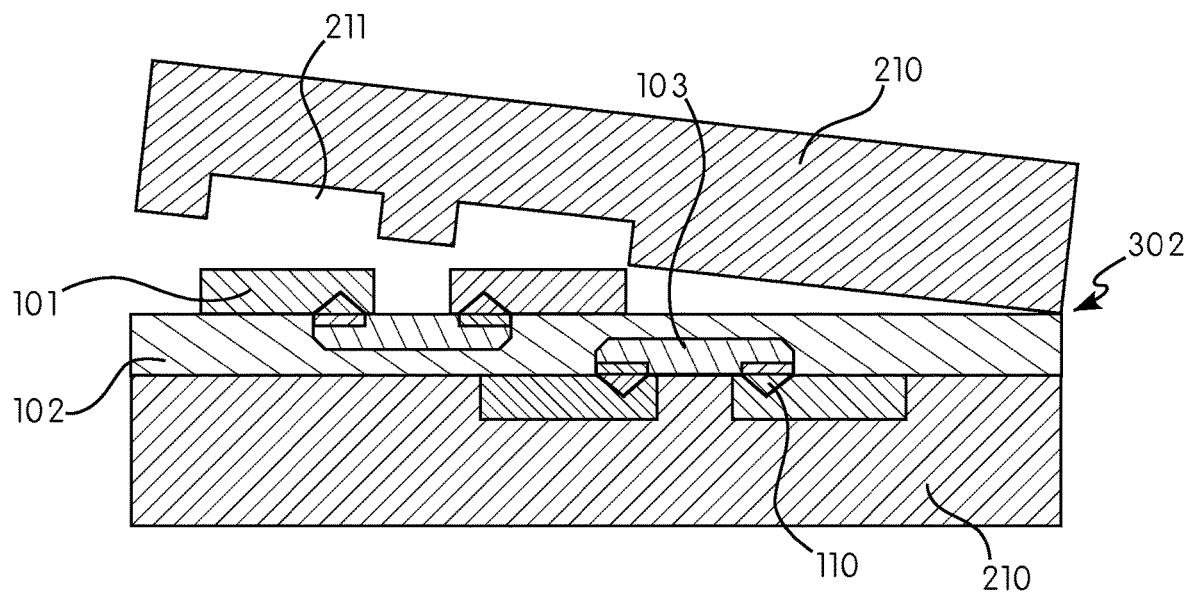
Figure 7C:
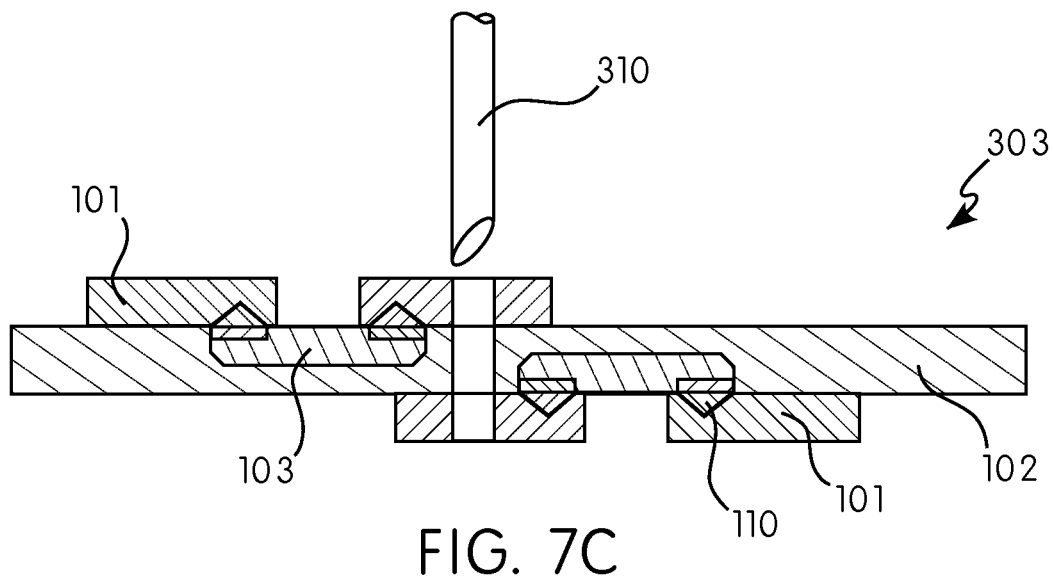
Figure 7D:
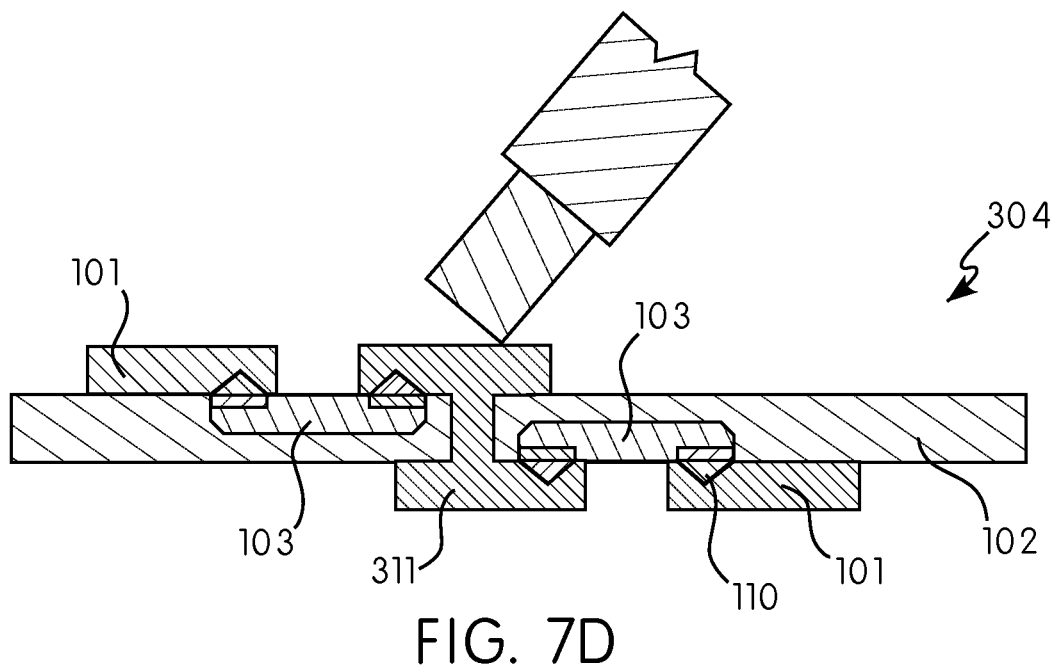
Figure 8:
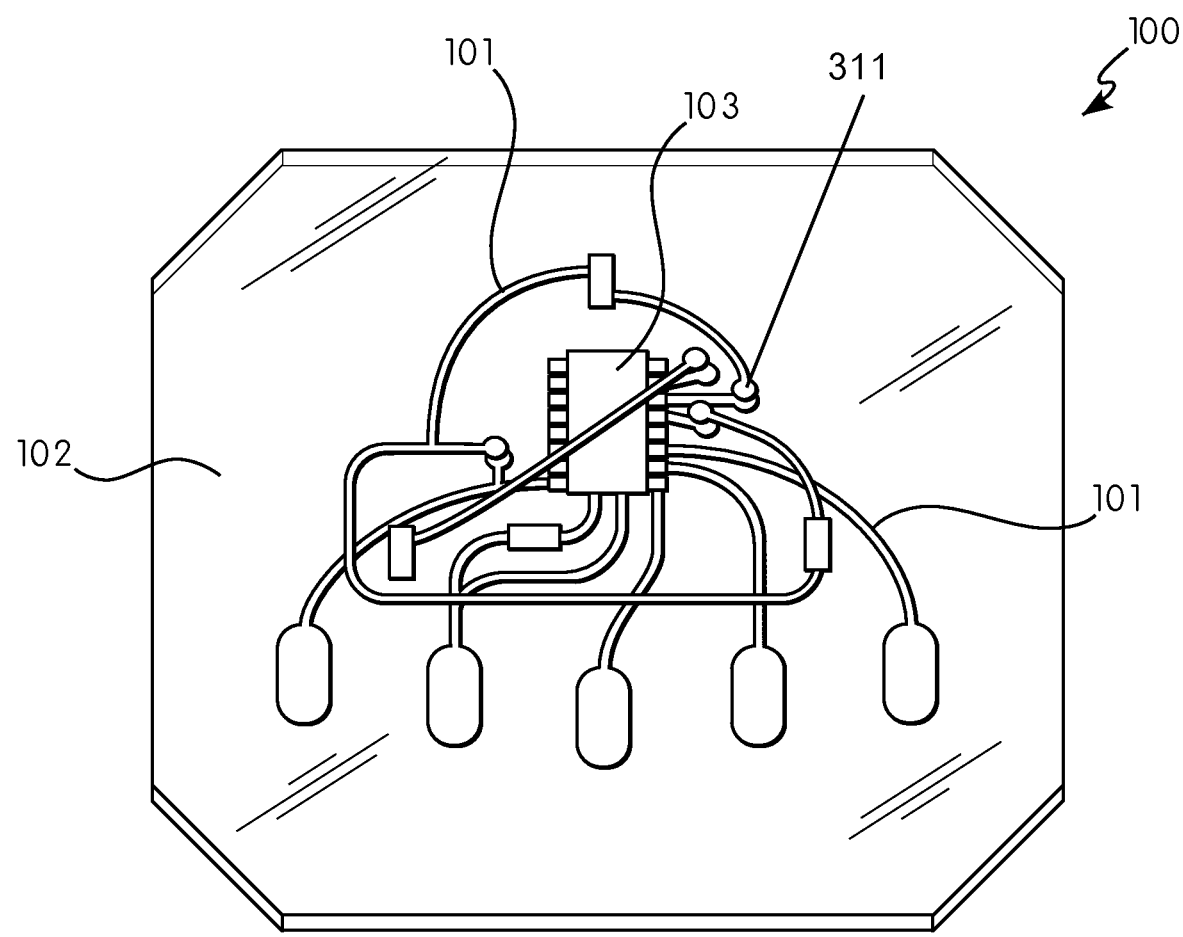
FIG. 8 shows an example of a multiple-layer flexible circuit.

As further detailed in FIG. 7A, at step 301, the two molds 210 are aligned. In one embodiment, a pin that is adapted to fit in a hole on each mold 210 is used to ensure proper alignment. At step 302, shown in FIG. 7B, the molds 210 are removed from the flexible circuit 100 after curing. At this stage, the flexible circuit 100 has multiple layers of conductive polymer 101, but each layer is not electrically connected. As such, at step 303, as shown in FIG. 7C, each layer of conductive polymer 101 and the flexible polymer base 102 is pierced with tool 310, creating a void traversing the depth of the circuit 100. In step 304, shown in FIG. 7D, conductive polymer 101 or epoxy 105 is used to fill the void, creating a via 311. With the via 311, the electrical pathways on each side of the polymer base 102 are electrically connected. FIG. 8 shows an example of a multiple-layer circuit 100, with the top layer electrically connected to the bottom layer through the use of vias 311.

In yet another alternative manufacturing method, the mold 210 has recesses 211 passing through the depth of the mold 210. In a process similar to screen printing, the conductive polymer 101 can be deposited onto the surface of the flexible polymer base 102. The integrated circuit components 103 can then be added in a manner similar to the processes described in step 203, with another layer of polymer base 102 used to cover the conductive polymer 101.

While the disclosure has been described in detail and with reference to specific embodiments thereof, it will be apparent to one skilled in the art that various changes and modification can be made therein without departing from the spirit and scope of the embodiments. Thus, it is intended that the present disclosure cover the modifications and variations of this disclosure provided they come within the scope of the appended claims and their equivalents.

What is claimed is:

1. A method of creating a flexible circuit comprising:
creating a first mold having a plurality of recesses, wherein the plurality of recesses replicate an electrical pathway of the flexible circuit;
depositing a conductive polymer into the recesses;
placing at least one integrated circuit component in contact with the conductive polymer,
thereby creating an indentation where an elongated electrical contact extending from the integrated circuit component penetrates the conductive polymer to form a mechanical interface,
wherein the elongated electrical contact has a distal end terminating in a point curing the conductive polymer;
removing the at least one integrated circuit component;
depositing conductive epoxy in the indentation;
repositioning the at least one integrated circuit component, wherein the elongated electrical contact is in contact with the conductive epoxy deposited in the indentation;
curing the conductive epoxy; and
covering the conductive polymer with a flexible polymer base.

2. The method of claim 1, further comprising:
curing flexible polymer base,
wherein the flexible polymer base bonds to the conductive polymer, thereby forming the flexible circuit.

3. The method of claim 1, further comprising:
adding a conductive polymer to a second mold; and
placing the second mold on the surface of the flexible polymer base prior to curing the conductive polymer and flexible polymer base,
wherein the second mold is placed on the surface of the flexible polymer base opposite a surface in contact with the first mold.

4. The method of claim 1, wherein the flexible polymer base substantially covers the at least one integrated circuit component.

5. The method of claim 1, wherein the elongated electrical contact comprises a bead of cone-shaped solder extending past a surface of the integrated circuit component.

6. The method of claim 1, wherein the conductive polymer comprises a plurality of conductive filler-particles dispersed in a flexible polymer.

7. The method of claim 1, wherein the flexible polymer base substantially encases the at least one integrated circuit component.

8. The method of claim 1, wherein the elongated electrical contact extends beyond a surface of the at least one integrated circuit component.

9. The method of claim 3, further comprising:
adding vias to connect the conductive polymer on each side of the flexible polymer base.

10. The method of claim 6, wherein the filler-particles comprise silver.

* * * * *